United States Patent [19]
Malka et al.

[11] Patent Number: 5,144,255
[45] Date of Patent: Sep. 1, 1992

[54] MULTIPLE SYNCHRONIZED AGILE PULSE GENERATOR

[75] Inventors: Jacob H. Malka, Fair Lawn, N.J.; Mordechai Friedlander, Chestnut Ridge, N.Y.

[73] Assignee: Allied-Signal Inc., Morris Township, Morris County, N.J.

[21] Appl. No.: 783,461

[22] Filed: Oct. 28, 1991

[51] Int. Cl.[5] .......................... H03K 5/13; H03K 3/04; H03B 19/00; G06M 3/00
[52] U.S. Cl. ........................................ 328/62; 328/14; 377/26; 377/44; 377/54; 307/269
[58] Field of Search ............... 307/265, 267, 269, 260, 307/268; 328/59, 60, 61, 62, 63, 74; 377/26, 44, 54, 55

[56] References Cited
U.S. PATENT DOCUMENTS
4,257,108  3/1981  Igel ........................................ 307/269
4,631,484 12/1986  Malka et al. ........................... 328/63

Primary Examiner—Stanley D. Miller
Assistant Examiner—Sinh Tran
Attorney, Agent, or Firm—Howard G. Massung; Robert A. Walsh

[57] ABSTRACT

A multiple synchronized agile pulse generator is configured as high speed digital/analog test apparatus for providing complex patterns associated with modern avionics systems. The multiple synchronized agile pulse generator includes a network of counters and random access memory (RAM) banks which allow for predetermined hopping of pulse repetition intervals, pulse widths, pulse patterns, pulse amplitudes, and combinations of the above.

15 Claims, 3 Drawing Sheets

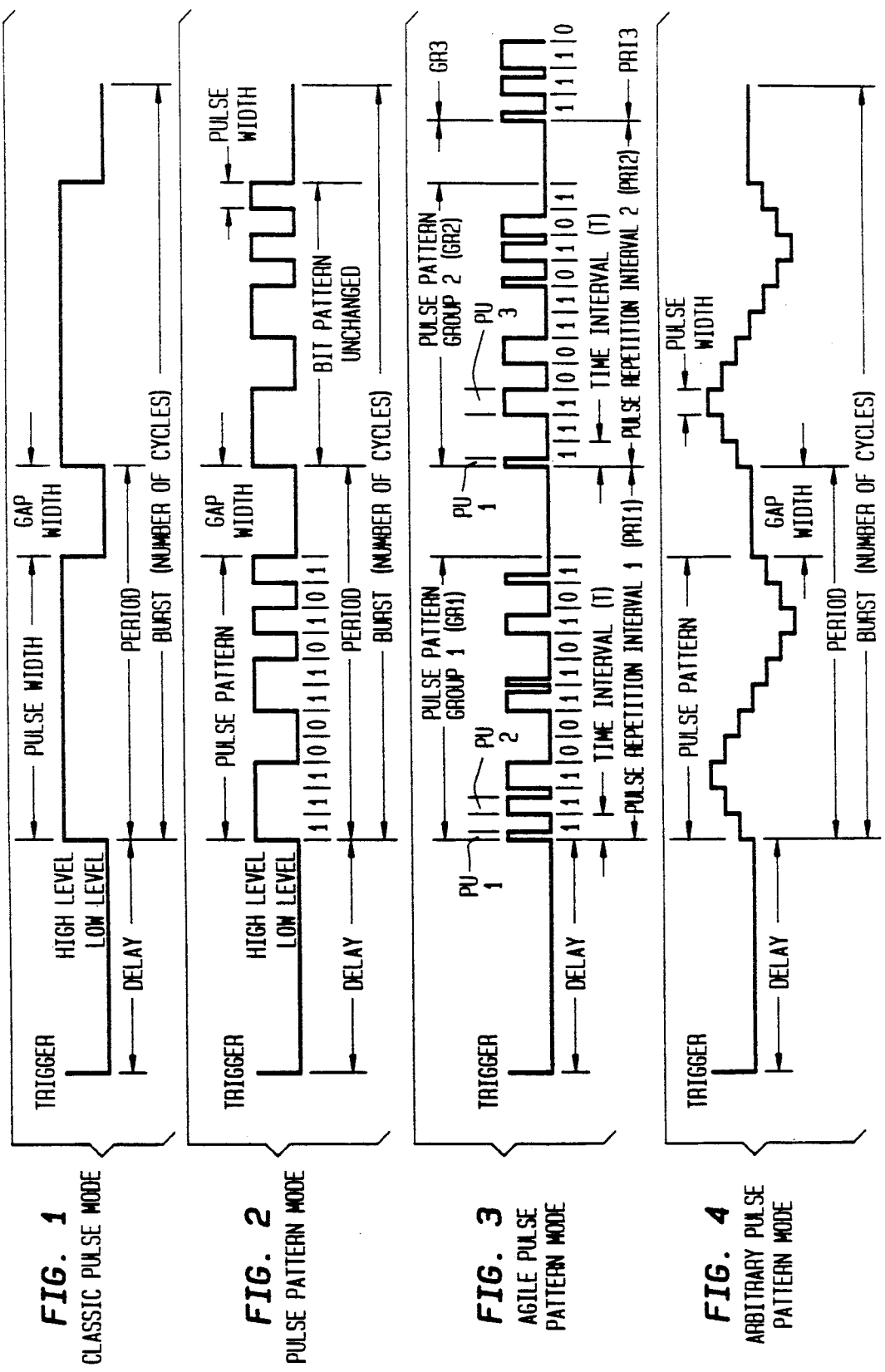

MULTIPLE SYNCHRONIZED AGILE PULSE GENERATOR

BACKGROUND OF THE INVENTION

This invention relates to a multiple synchronized agile pulse generator and particularly, to a multiple synchronized agile pulse generator which is configured as high speed digital/analog test apparatus for providing complex pulse patterns required to test modern avionics systems, such as, for example, those associated with electronic warfare. More particularly, this invention relates to a multiple synchronized agile pulse generator featuring a unique network of counters and memory devices which allow for predetermined hopping of pulse repetition intervals/rates (PRI's), pulse widths (PW's), pulse patterns (PP's), pulse amplitudes (PA's), and combinations thereof.

Complex pulse patterns are usually provided by pulse pattern generators, arbitrary function generators, or some combination of both. In prior art arrangements, the output patterns or waveforms are stored serially in memory which is sequentially scanned. Modern electronic warfare systems, for example, require complex patterns whose parameters (pulse repetition intervals, pulse widths, pulse patterns, pulse amplitudes, etc.) are being constantly modified independent of each other, which makes it impossible to serially store these parameters in any practical size memory. For example, at any one time, a particular pulse repetition interval may be associated with a particular pulse pattern which, in turn, will initiate an output of a series of pulses of varying width. The next time the same pulse repetition interval is encountered, either immediately or after a predetermined number of cycles, it may be associated with a different pulse pattern, initiating a different output.

The present invention accommodates this feature by providing the capability of providing continuous preprogrammed parameter modification through the implementation of individual memory blocks.

SUMMARY OF THE INVENTION

This invention contemplates a multiple synchronized agile pulse generator which provides continuous program parameter modification by implementing individual memory blocks, not only to store pulse patterns and amplitudes but also to store the duration of multiple pulse repetition intervals, pulse patterns and pulse widths. Independent synchronous counters are used to apply time characteristics to these parameters, and are continuously reloaded with different count values as required. The pulse patterns are loaded in a word-wide memory. Therefore, an individual amplitude is associated with each pulse to generate arbitrary pulse patterns. Versatility is enhanced by providing means for synchronization between channels and the capability of selecting between various triggering modes.

BRIEF DESCRIPTION OF THE DRAWINGS

FIG. 1 is a pulse diagram illustrating a classic pulse mode of the multiple synchronized agile pulse generator (MSAPG) of the invention.

FIG. 2 is a pulse diagram illustrating a pulse pattern mode of the MSAPG.

FIG. 3 is a pulse diagram, illustrating an agile pulse pattern mode of the MSAPG.

FIG. 4 is a pulse diagram illustrating an arbitrary pulse pattern mode of the MSAPG.

DETAILED DESCRIPTION OF THE INVENTION

With reference to FIG. 1, the classic pulse mode has only six variables: period, pulse width, high-level amplitude, low-level amplitude, delay and burst (number of cycles). All variables stay unchanged during an output burst. The period is the common factor of pulse width (PW) and gap width (GW). Gap width is equal to the period minus pulse width as can be discerned from the Figure. The minimum memory size required is based on the period, the required resolution and the ratio of pulse width to gap width.

With reference to FIG. 2, the pulse pattern mode can be viewed as a logic AND of the pulse width in the classic pulse mode illustrated in FIG. 1, with a serial bit pattern. The pattern masks portions of the pulse. The classic pulse width is replaced by pattern length and the duration of a single bit in the pattern is defined as the pulse width. Minimum memory size that is required is multiplied by the number of the pulses in the pattern.

With reference to FIG. 3, the agile pulse pattern mode has a number of different pulse repetition intervals, pulse widths and pulse pattern groups, which introduce different serial masks to the output. The unmasked pulses may be assigned arbitrary amplitudes. The number of different elements in each set of pulse repetition intervals, pulse widths and pulse pattern groups, is arbitrary and independent, as is the number of each element that repeats before switching to the next element.

Figure 5:
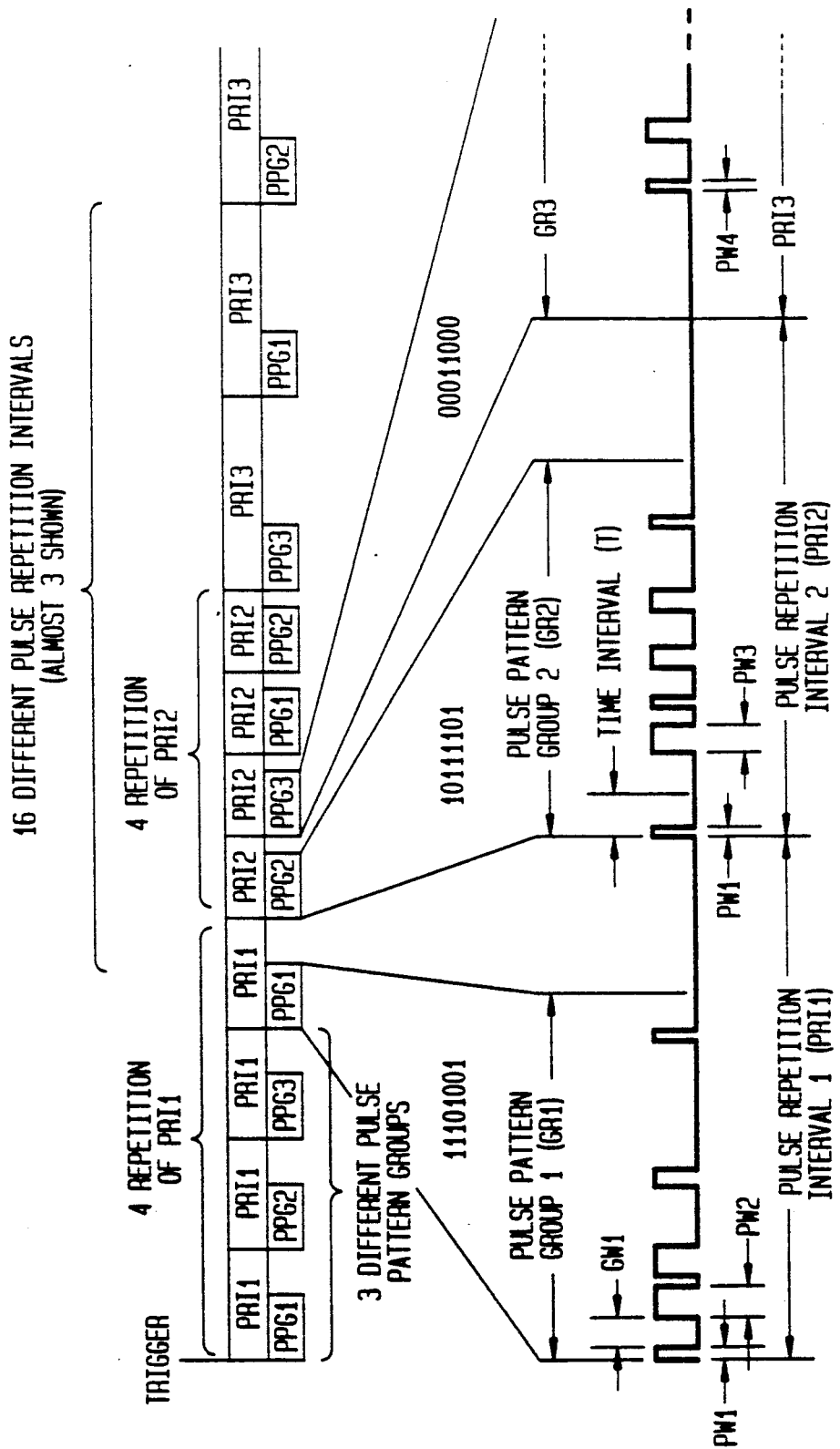
FIG. 5 is a diagram further illustrating the agile pulse pattern mode illustrated in FIG. 3.

In further illustration of the agile pulse pattern mode, FIG. 5 refers to sixteen different pulse repetition intervals, only three of which are shown for the purpose of illustration. Each pulse repetition interval (PRI) repeats four times, with three different pulse pattern groups (PPG's) and eight distinct pulse widths (PW's) of the same amplitude. Using a conventional serial random access memory (RAM), i.e. storing the complete pattern in memory and scanning this memory sequentially the way prior art pulse pattern generators or arbitrary function generators do, requires for each individual pulse/gap combination the same amount of memory needed for a single classic pulse. This number, which can be quite large depending upon resolution, must further be multiplied by the product of all the variables noted above (the number of different pulse repetition intervals, the number of their repetitions, the number of different pulse pattern groups, the number of their repetitions and the number of different pulse widths) to cover all possible permutations. A typical application, using conventional instrumentation, would require seven million memory words which have to be rapidly scanned to allow for real time applications as will be readily discerned.

With reference to FIG. 4, in the arbitrary pulse pattern mode, the amplitude of the pulses is allowed to vary during the pulse burst. This mode can be used to initiate pseudo-waveforms, i.e. sine waves. There are no additional requirements for memory "length", but memory "width" is needed to provide the amplitude variations. A bit wide memory is no longer sufficient for this purpose.

The multiple synchronized agile pulse generator (MSAPG) of the invention assigns separate memory blocks to the major agile pulse variable parameters: pulse repetition intervals, pulse widths and pulse pattern groups. In addition, an arbitrary amplitude may be assigned by a pattern memory to each individual pulse in the pattern. These separate memory blocks are synchronized with each other but are scanned independently to allow for any possible permutation.

Figure 6:
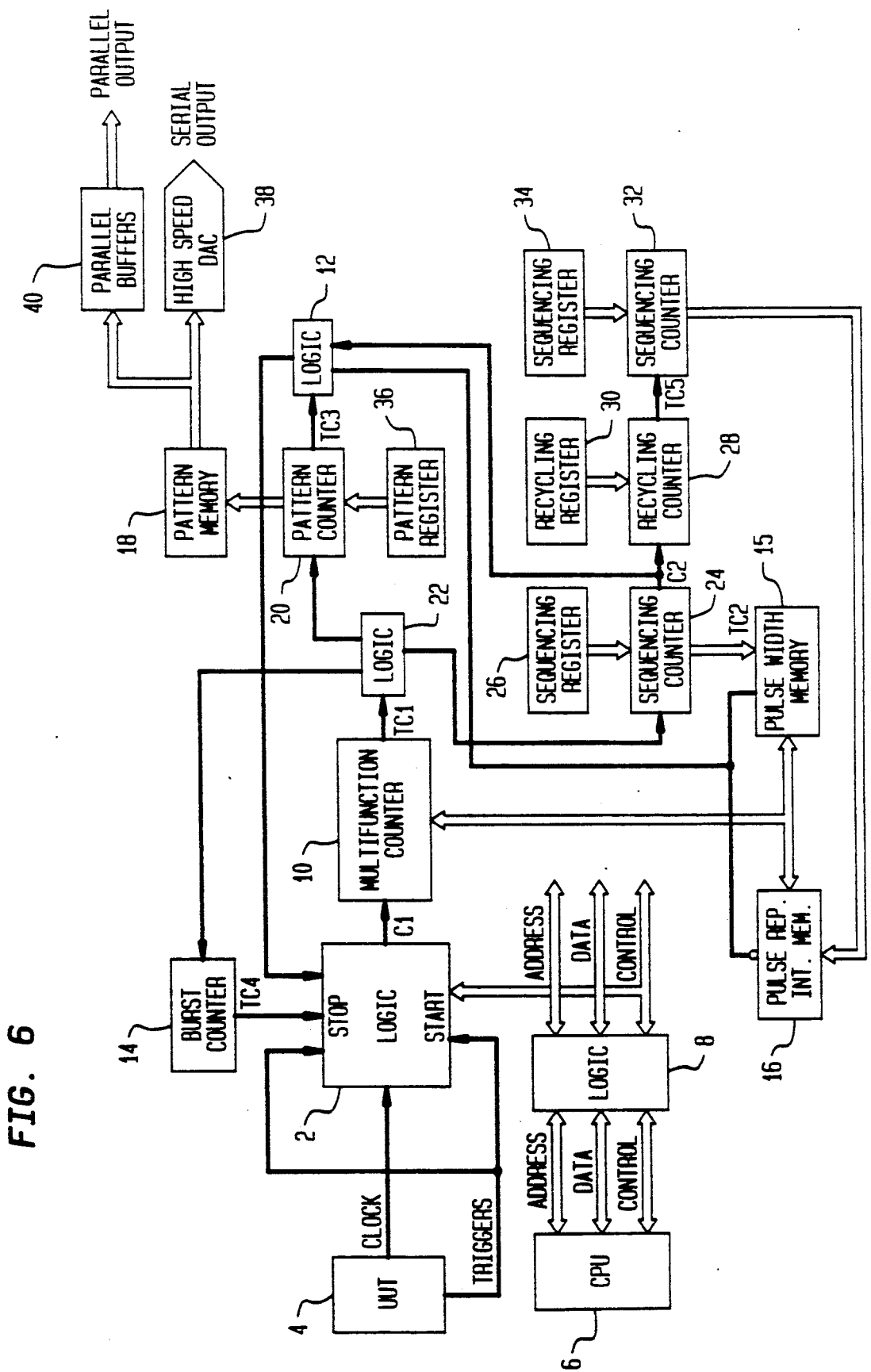
FIG. 6 is a block diagram illustrating the multiple synchronized agile pulse generator (MSAPG) of the invention.

Reference is now made to FIG. 6 which illustrates the structural features of the invention.

Logic 2 receives clock and trigger pulses from external sources such as a unit under test (UUT) 4, other MSAPG channels, other test equipment, etc., as well as address, data and control commands from a central processing unit 6 via logic 8. Logic 2 controls a clock signal C1 applied to a multi-function counter 10 and also controls synchronization with other signal sources.

The clock start function of logic 2 is controlled by a trigger via UUT 4 (as illustrated) or by software, as the case may be. The clock stop function is controlled by a trigger via UUT 4, an end cycle from a logic 12, an end-burst from a burst counter 14 (as illustrated), or by software, as the case may be. Operating modes of the MSAPG and their combinations are selected by the programmable configuration of logic 2, i.e. clock sources, trigger sources, means for start, stop and synchronization, single or multiple bursts and continuous output.

Multi-function counter 10 provides pulse repetition intervals and pulse width hopping, which is an important feature of the arrangement herein disclosed. The data input to counter 10 dynamically changes at the end of each counter cycle and thus provides means for scanning the complete range of pulse widths and pulse repetition intervals. Since the pulse widths are stored in a random access pulse width memory (RAM) 15, the pulse repetition intervals are stored in pulse repetition interval memory (RAM) 16, and the pulse patterns are stored in a pattern memory (RAM) 18, total memory size is the sum of the number of these variables and not the product of them as would otherwise be the case with serial random access memory (RAM) storage.

Additionally, since multi-function counter 10 controls the clocking rate of a pattern counter 20 via logic 22, each individual pulse/gap combination requires only two memory locations in pulse width memory 15 to store pulse timing and gap timing, and two memory locations in pattern memory 18 to store their amplitudes. The same applies for pulse repetition intervals. That is to say, one location in memory 16 is required for pulse repetition interval timing and one location in pattern memory 18 is required for its amplitude.

Multi-function counter 10 is clocked by a signal C1 from logic 2 as aforenoted. The count input data to multi-function counter 10 is applied, alternately, by two independent memory blocks, i.e. pulse width timing memory 15 and pulse repetition interval memory 16.

Pulse width memory 15 contains a sequence of the various pulse widths and gap widths. Gap widths separate the pulse widths. Test requirements documents usually specify as a parameter the required period rather than the gap width and CPU 6 determines the various gap widths (following the formula $GW_i = T - PW_i$, where GW = Gap width, T = period and PW = pulse width) and "inserts" each one after its corresponding pulse width.

Pulse width memory 15 is scanned by a pulse width sequencing counter 24 which is clocked via logic 22. Counter 24 is loaded from a pulse width sequencing register 26. This mode of operation continues until the complete sequence of various pulse widths/gap widths is provided once. Pulse width memory 15 is independent from pulse pattern group masks which are stored in pattern memory 18, although they occur simultaneously, being clocked by the same signal. An initial delay, if required, is loaded into multi-function counter 10 previous to the pulse width sequence.

When counter 24 completes its cycle, its terminal count TC2 toggles the data input of multi-function counter 10 from pulse width memory 15 to pulse repetition interval memory 16. Memory 16 contains the sequence of the final pulse repetition intervals which constitute the larger gaps ("dead" periods) between the pulse pattern groups. The "final" pulse repetition intervals are defined as the program pulse repetition intervals after subtracting the total duration of the combined pulse widths and gap widths in a single group.

The terminal count TC2 of pulse width sequencing counter 24 also sends a clock output C2 to a recycling counter 28 which is loaded from a recycling register 30. The function of recycling counter 28 is to determine for how many consecutive pulse pattern groups a pulse repetition interval will remain unchanged. When the terminal count TC5 of recycling counter 28 is issued, a sequencing counter 32 is clocked causing pulse repetition interval memory 16 to step to the next pulse repetition interval in line to be loaded in multi-function counter 10 after completion of another pulse width/gap width group. Sequencing counter 32 is loaded from a pulse repetition interval sequencing counter 34.

Each time multi-function counter 10 completes a cycle and issues a terminal count TC1 it also clocks, via logic 22, the pattern counter 20 which is loaded from a pattern register 36. Pattern counter 20 is responsible for scanning pattern memory 18 which contains the sequence of the pulse pattern group masks and the pulse amplitudes associated therewith. When a regular (non-agile) pulse pattern output is desired, pattern memory 18 has the capability of containing word-wide data for output. When a "classic" pulse generation output is required, the terminal count TC3 of pattern counter 20 is utilized via logic 12 to toggle between pulse width memory 15 and pulse repetition interval memory 16. In this case, only one memory location is used and each of the two memory banks 15 and 16 restore the single pulse width and the single gap width associated with this output mode.

Pattern memory 18 feeds amplitude data to a high speed digital to analog converter (DAC) 38 which supplies current to an output amplifier (not shown). Alternatively, pattern memory 18 can be loaded with word-wide data for sequential output to parallel buffers 40, bypassing digital to analog converter 38 and thus allowing the MSAPG to function as a digital word generator. Output impedance and rise/fall times can also be program controlled as may be desireable, the same not being shown in FIG. 6.

Each cycle when completed clocks burst counter 14. By manipulating logic 22 and logic 12, it can be determined what constitutes a particular cycle in different modes of operation. Upon completing its program count, burst counter 14, if enabled, sends a terminal count TC4 to logic 2 to stop the clock and subsequently the output. Burst counter 14 is not associated with the register since its count is loaded only once. Logic 8 interfaces with external address data and control buses and is responsible for communication with central processing unit 6 and for the distribution of data, address and control commands within the MSAPG. The actual lines over which these signals are applied are not shown in order to simplify FIG. 6.

There has thus been described a multiple synchronized agile pulse generator which is configured as high speed digital/analog test apparatus for providing complex pulse patterns required to test modern avionics systems, particularly those associated with electronic warfare. The multiple synchronized agile pulse generator consists of a unique network of counters and memory banks which allow for predetermined hopping of pulse repetition intervals, pulse widths, pulse patterns, pulse amplitudes and combinations of the above.

It will be understood that the components of the invention such as the several counters and memory components referred to herein are commercially available, with the invention being directed not to the components themselves but to the particular arrangement thereof.

With the above description of the invention in mind, reference is made to the claims appended hereto for a definition of the scope of the invention.

What is claimed is:

1. A multiple synchronized agile pulse generator, comprising:
   first logic means for providing a clock output;
   multifunction counter means connected to the first logic means for receiving the clock output therefrom and for providing first controlling outputs;
   first memory means for storing pulse width data;
   second memory means for storing pulse repetition interval data;
   the first and second memory means connected to the multifunction counter means for alternately applying the stored pulse width data and the stored pulse repetition interval data to the multifunction counter means, with said multifunction counter means providing the first controlling outputs in response to the clock output received thereby and to the pulse width and pulse repetition interval data applied thereto;
   second logic means connected to the multifunction counter means and responsive to the first controlling outputs therefrom for providing second controlling outputs;
   pattern counter means connected to the second logic means, with the second controlling outputs from the second logic means controlling the clocking rate of the pattern counter means, and said pattern counter means providing pulse pattern data;
   third memory means connected to the pattern counter means for storing the pulse pattern data therefrom; and
   means connected to the third memory means for accessing the stored pulse pattern data.

2. A pulse generator as described by claim 1, wherein:
   the first logic means is connected to an external signal source for receiving clock and trigger pulses therefrom and for providing the clock output in response thereto; and
   third logic means connected to an external command source for receiving commands therefrom, and connected to the first logic means for applying said commands thereto so that said first logic means provides the clock output.

3. A pulse generator as described by claim 2, including:
   a "start" function of the first logic means being initiated by a trigger pulse from the external signal source;
   a burst counter connected to the second logic means and responsive to a controlling output therefrom for providing an end-burst output and connected to the first logic means;
   fourth logic means connected to the pattern counter means and to the first logic means, said fourth logic means being responsive to an end of a data cycle of the pattern counter means for providing an end-cycle output; and
   a "stop" function of the first logic means being initiated by a trigger pulse from the external source, the end-burst output from the end-burst counter and the end-cycle output from the fourth logic means.

4. A pulse generator as described by claim 2, including:
   first sequencing counter means connected to the second logic means and to the first memory means;
   first sequencing register means connected to the first sequencing counter means for loading said first sequencing counter means;
   the first sequencing counter means being controlled by the second logic means for scanning the first memory means during a cycle of said first memory means, and for providing a terminal count at the completion of said cycle; and
   the first memory means connected to the second memory means, with the first memory means being responsive to the terminal count therefrom so that the data applied to the multifunction counter means is toggled from the first memory means to the second memory means.

5. A pulse generator as described by claim 4, including:
   a recycling counter connected to the first sequencing counter;
   a recycling register for loading the recycling counter; and
   the first sequencing counter controlling the recycling counter, whereupon the recycling counter provides a total count output indicating for how many pulse pattern groups a pulse repetition rate will remain unchanged.

6. A pulse generator as described by claim 5, including:
   a second sequencing counter connected to the recycling counter;
   a second sequencing register for loading the second sequencing counter; and
   the second sequencing counter being connected to the second memory means and responsive to the total count output from the recycling counter for enabling the second memory means to step to a next pulse repetition interval to be loaded in the multifunction counter means.

7. A pulse generator as described by claim 6, including:
   a pattern register connected to the pattern counter means for loading said pattern counter means;
   the pattern counter means being controlled by a controlling output from the second logic means and providing a terminal controlling output each time the multifunction counter means completes a cycle; and said pattern counter means being effective for scanning the third memory means.

8. A multiple synchronized agile pulse generator of the type responsive to externally provided clock, trigger and command signals, comprising:

first logic means responsive to the externally provided clock, trigger and command signals for providing the clock output;

second logic means receiving the externally provided command signals and connected to the first logic means for applying commands in response thereto to the first logic means so that said first logic means provides the clock output;

multifunction counter means connected to the first logic means for receiving the clock output therefrom and for providing first controlling outputs;

first memory means for storing pulse width data;

second memory means for storing pulse repetition interval data;

the first and second memory means connected to the multifunction counter means for alternately applying the stored pulse width data and the stored pulse repetition interval data to the multifunction counter means, with said multifunction counter means providing the first controlling outputs in response to the clock output received thereby and to the data applied thereto;

third logic means connected to the multifunction counter means and responsive to the first controlling outputs therefrom for providing second controlling outputs;

pattern counter means connected to the third logic means, with the second controlling outputs therefrom controlling the clocking rate of the pattern counter means, said pattern counter means providing pulse pattern data;

third memory means connected to the pattern counter means for storing the pulse pattern data therefrom; and means connected to the third memory means for accessing the stored pulse pattern data.

9. A pulse generator as described by claim 8, including:

a "start" function of the first logic means being initiated by a trigger pulse from the external signal source;

a burst counter connected to the second logic means and responsive to a controlling output therefrom for providing an end-burst output and connected to the first logic means;

fourth logic means connected to the pattern counter means and to the first logic means, said fourth logic means being responsive to an end of a data cycle of the pattern counter means for providing an end-cycle output; and a "stop" function of the first logic means being initiated by a trigger pulse from the external source, the end-burst output from the end-burst counter and the end-cycle output from the fourth logic means.

10. A pulse generator as described by claim 8, including:

first sequencing counter means connected to the second logic means and to the first memory means;

first sequencing register means connected to the first sequencing counter means for loading said first sequencing counter means;

the first sequencing counter means being controlled by the third logic means for scanning the first memory means during a cycle of said first memory means, and for providing a terminal count at the completion of said cycle; and the first memory means connected to the second memory means, with the first memory means being responsive to the terminal count therefrom so that the data applied to the multifunction counter means is toggled from the first memory means to the second memory means.

11. A pulse generator as described by claim 10, including:

a recycling counter connected to the first sequencing counter;

a recycling register for loading the recycling counter; and the first sequencing counter controlling the recycling counter, whereupon the recycling counter provides a total count output indicating for how many pulse pattern groups a pulse repetition interval will remain unchanged.

12. A pulse generator as described by claim 11, including:

a second sequencing counter connected to the recycling counter;

a second sequencing register for loading the second sequencing counter; and the second sequencing counter being connected to the second memory means and responsive to the total count output from the recycling counter for enabling the second memory means to step to a next pulse repetition interval to be loaded in the multifunction counter means.

13. A pulse generator as described by claim 12, including:

a pattern register connected to the pattern counter means for loading said pattern counter means;

the pattern counter means being controlled by a controlling output from the third logic means and providing a terminal controlling output each time the multifunction counter means completes a cycle and; and said pattern counter means being effective for scanning the third memory means.

14. A multiple synchronized agile pulse generator, comprising:

first means for providing first controlling outputs;

first memory means for storing pulse width data;

second memory means for storing pulse repetition interval data;

the first and second memory means connected to the first means for alternately applying the stored pulse width data and the stored pulse repetition interval data thereto, with said first means providing the first controlling outputs in response to the applied data;

second means connected to the first means and responsive to the first controlling outputs therefrom for providing second controlling outputs;

pattern counter means connected to the second means, with the second controlling outputs controlling the clocking rate of the pattern counter means so that said pattern counter means provides pulse pattern data;

third memory means connected to the pattern counter means for storing the pulse pattern data therefrom; and means connected to the third memory means for accessing the stored pulse pattern data.

15. A pulse generator as described by claim 14, wherein the first means includes:

first logic means connected to an external signal source for receiving clock and trigger pulses therefrom and for providing a clock output in response thereto;

second logic means connected to an external command source for receiving commands therefrom, and connected to the first logic means for applying said commands thereto so that the first logic means provides the clock output; and multifunction counter means connected to the first logic means and responsive to the clock output therefrom for providing the first controlling outputs.

* * * * *